United States Patent [19]
Glenn et al.

[11] Patent Number: 5,796,163
[45] Date of Patent: Aug. 18, 1998

[54] SOLDER BALL JOINT

[75] Inventors: Thomas P. Glenn, Gilbert, Ariz.; Roy D. Hollaway, Paranaque, M.M., Philippines; Anthony E. Panczak, Sunnyvale, Calif.

[73] Assignee: Amkor Technology, Inc., Chandler, Ariz.

[21] Appl. No.: 862,687

[22] Filed: May 23, 1997

[51] Int. Cl.$^6$ .................................................. H01L 23/04

[52] U.S. Cl. .................................. 257/698; 257/780

[58] Field of Search .......................... 257/698, 780, 257/781, 779, 758

[56] References Cited

U.S. PATENT DOCUMENTS

| | | |
|---|---|---|
| 5,241,133 | 8/1993 | Mullen, III et al. ............ 174/52.4 |
| 5,450,290 | 9/1995 | Boyko et al. . |
| 5,512,786 | 4/1996 | Imamura et al. .................. 257/780 |
| 5,640,047 | 6/1997 | Nakashima . |
| 5,689,091 | 11/1997 | Hamzehdoost et al. . |

OTHER PUBLICATIONS

Kyocera Corporation advertisement for a Dimpled Ball Grid Array ("DBGA") integrated circuit package, retrieved on Aug. 19, 1997 from Kyocera Corporation's web site at www.kyocera.com/kai/dbga.html. Date of initial publication unknown.

*Primary Examiner*—Mahshid D. Saadat
*Assistant Examiner*—S. V. Clark
*Attorney, Agent, or Firm*—Skjerven, Morrill, MacPherson, Franklin & Friel LLP; Thomas S. MacDonald; James E. Parsons

[57] ABSTRACT

An improved interconnection ball joint for a ball grid array integrated circuit package includes a substrate base having a first surface to which an integrated circuit die is affixed, and an opposite second surface. A metallized via extends through the substrate. The via has a central hole which extends through the substrate. The hole is plugged with a flexible nonconductive material, such as epoxy solder mask material. A metallic interconnection ball land is on the second surface of the substrate, integral with the metallized via and adjacent to the hole and the plug of nonconductive material. A solder interconnection ball is formed on the land, opposite the via and the plug of nonconductive material. A metal-to-metal annular bond is formed at the joint between the interconnection ball and the land around the plug of nonconductive material in the center of the via. The joint has an unexpectedly high shearing strength, and resists cracking, which reduces risks of a electrical connectivity failure at the joint. Location of the interconnection ball directly opposite the via allows miniaturization of the package.

13 Claims, 2 Drawing Sheets

SOLDER BALL JOINT

FIELD OF THE INVENTION

The present invention relates to integrated circuit packages, and in particular to a solder interconnection ball joint for ball grid array packages.

BACKGROUND OF THE INVENTION

Integrated circuit die are typically housed in closed packages. The packages include internal and external structures for electrically connecting the die in the package to external circuitry, e.g., a circuit board. One known type of package is a ball grid array ("BGA") package.

BGA packages characteristically have an array of solder interconnection balls, sometimes described as "bumps", in a selected pattern on a bottom external portion of the package. The interconnection balls are placed on metallic portions of an external circuit board, heated, and upon re-solidifying, form conductive, metal-to-metal bonds with metallization or metal traces the circuit board.

BGA packages typically have a flat, insulating substrate base having first and second surfaces. The integrated circuit die enclosed in the package is above an interior first surface of the substrate. The substrate has a plurality of through-holes drilled between its interior (i.e., within the package) first surface and exterior second surface. The circumference of each drilled through-hole is lined throughout its entire length with metal, so that a conductive metallized via is formed between the interior and exterior surfaces of the substrate. The hole at the center of the via may become filled with epoxy solder mask material as a result of manufacturing steps which apply layers of epoxy solder mask material onto the surfaces of the substrate.

Metal conductive structures within the package, such as metal traces on the interior first surface of the substrate and bond wires, electrically connect the metal lining of each of the vias to contact pads on the die. At an opposite end of each via, at the exterior second surface of the substrate, the metal of the via is electrically connected to metal lines or traces on the exterior surface of the substrate. These metal traces extend laterally away from the via to a flat metal interconnection ball land on the exterior surface of the substrate. Hence, the land is displaced from the metallized via.

A heated solder interconnection ball is placed on the exposed metal surface of the land. Upon re-solidification of the solder, an interconnection ball joint is formed at the intersection of the interconnection ball and the metal surface of the land. The metal-to-metal bond between the interconnection ball and the land at the joint is uninterrupted, with no purposeful discontinuities or voids.

BGA packages having such uninterrupted metal-to-metal bonding at their interconnection ball joints are prone to electrical connectivity failures. Applicants have discovered, for example, in packages where solder interconnection balls are in an uninterrupted metal-to-metal bond with a nickel layer of an interconnection ball land, that the nickel layer tends to crack, causing a failure in the electrical connection between the interconnection ball and the package.

Accordingly, there is a need for a package, which may be readily manufactured and is not susceptible, or is less susceptible, to failure by cracking at the metal-to-metal joint between a land on the package substrate and the interconnection ball.

SUMMARY OF INVENTION

Embodiments of an improved interconnection ball joint for a ball grid array ("BGA") integrated circuit package are disclosed. The joint has improved cracking resistance compared to the interconnection ball joints on conventional BGA packages.

The package has a substrate base. The substrate has a first surface and an opposite second surface. The integrated circuit die is affixed, such as by a conventional adhesive, to the first surface of the substrate. A metal-lined via extends through the substrate from the first surface to the second surface of the substrate. This metallized via has a central hole, i.e., within the metal plating that lines the walls of the via. The hole extends throughout the length of the via, i.e., through the substrate from the first surface to the second surface of the substrate.

A planar metallic interconnection ball land is formed on the second surface of the substrate. The land is integral with the metal lining of the metallized via. The land is adjacent to and formed around the via and the hole.

The central hole within the metal lining of the via contains, at least adjacent to the land, a plug of a flexible nonconductive material, such as epoxy solder mask material. In the example, the plug of nonconductive material within the via extends throughout the entire length the hole through the substrate.

A metallic solder interconnection ball is placed symmetrically and accurately on the planar surface of the land, forming an interconnection ball joint. At the joint, the interconnection ball is centered on and opposite the metallized via and the plug of nonconductive material in the central hole of the via. The interconnection ball forms a metal-to-metal annular bond with the land around the plug of nonconductive material in the central hole of the via.

In contrast with the interconnection ball joints of conventional BGA packages, which have uninterrupted metal-to-metal bonds at the joints between the interconnection balls and lands, joints in accordance with the present invention have a discontinuity in their metal-to-metal bonds. In the embodiments described herein, the metal-to-metal bonding at the joint occurs around the approximately circular surface of the plug of nonconductive material in the central hole of the metallized via.

Joints in accordance with the present invention unexpectedly demonstrate superior shearing strengths and cracking resistance, compared to conventional interconnection ball joints, due to the presence of such discontinuities in the metal-to-metal bonding at the joint. This reduces the risk of electrical failure due to cracking at the joint. Moreover, the embodiments described herein achieve this result in a manner which allows miniaturization of the package itself, because the interconnection balls are placed directly below the conductive vias through the substrate, eliminating the need for some or all metal traces on the external lower substrate surface.

A example package employs a plurality of such interconnection ball joints. The integrated circuit die within the package is electrically connected to the interconnection balls by a conductive path that extends through the metallized vias and the interconnection ball lands. The die and the other structures on the first surface of the substrate are encapsulated in a conventional encapsulating material, such as plastic.

DETAILED DESCRIPTION

Figure 1:
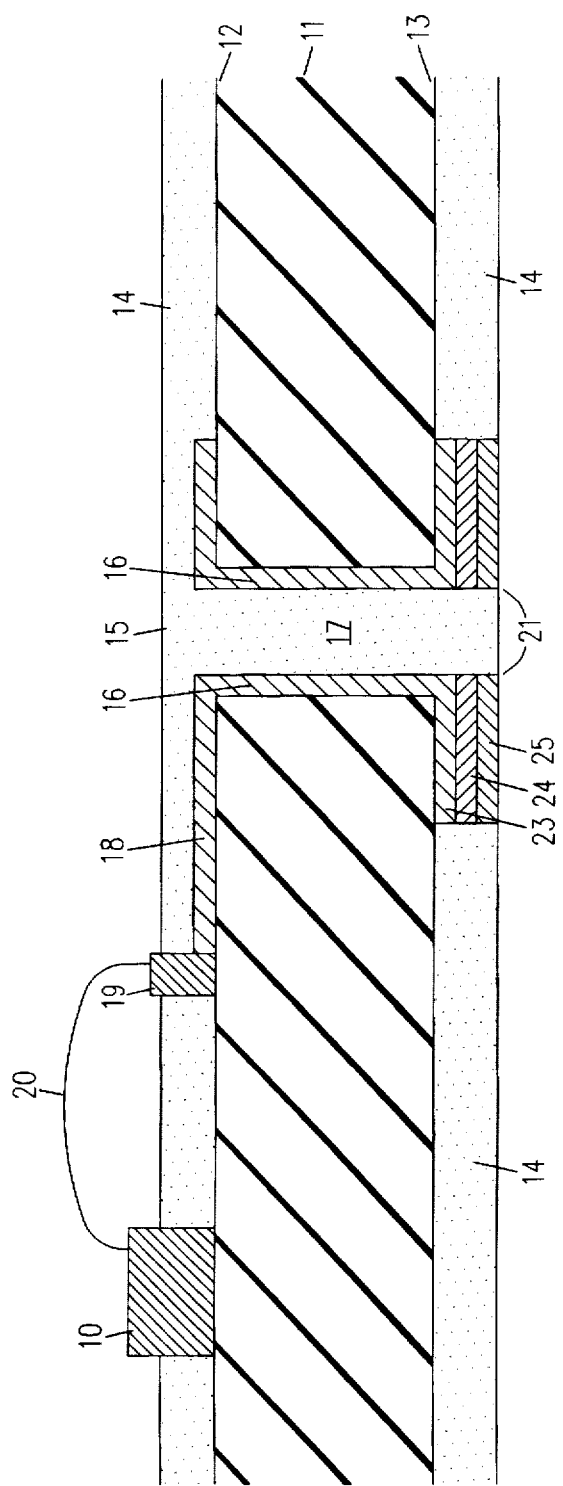
FIG. 1 is a cross-sectional side view of a portion of a BGA package, before encapsulation of the die and bond wires, which displays a single interconnection ball land prior to placement of an interconnection ball on the land.

FIG. 1 shows relevant portions of an exemplary BGA package in accordance with the present invention, before an interconnection ball is placed on the package and before encapsulation of the die and bond wires. Substrate 11 is a substantially planar sheet of a nonconductive material. Substrate 11 forms an insulating base of the BGA package.

Substrate 11 has an upper first surface 12. Inside the package, integrated circuit die 10 rests on and is affixed to upper first surface 12. Substrate 11 has a lower second surface 13, which is opposite upper first surface 12. Lower second surface 13 forms the external underside of the BGA package. Portions of upper first surface 12 and lower second surface 13 of substrate 11 are covered by layers 14 of a non-conductive epoxy solder masking material.

In this embodiment, substrate 11 is formed of a flat non-conductive laminate. An example thickness of substrate 11 is 0.36 mm to 0.56 mm, but the thickness may vary depending on the package application. Examples of suitable laminates include Mitsubishi-BT, Arlon 45N, and Nelco BT. Alternatively, substrate 11 may be ceramic or insulated metal.

Metallized via 15 of FIG. 1 is a metal-lined, epoxy-filled circular drill hole that extends though substrate 11, from upper first surface 12 to lower second surface 13. Lining the circumferential walls of via 15, throughout its length and about its entire circumference, is conductive metal plating 16. Within the metallized walls of via 15, throughout its length and adjacent to plating 16, is plug 17. Plug 17 fills the central hole within metal lining 16 of via 15.

Plug 17 is formed of a compliant, non-conductive material. In the example of FIG. 1, plug 17 is formed of epoxy solder mask material like layers 14. However, the material of plug 17 does not necessarily have to be the same as the material of layers 14.

Metallized via 15 of FIG. 1 may be formed by, first, drilling a circular hole through substrate 11. An example drill hole diameter is approximately 0.3 mm. Then, metal plating 16 is deposited on the walls of the drill hole, throughout its length and about its entire circumference, forming a conductive path through substrate 11. Metal plating 16 may be a layer of copper that is 0.0025 mm thick that is deposited by a conventional PTH copper plating process.

After the metal plating step, there is an unfilled hole at the approximate center of via 15, within metal plating 16. This central hole extends the length of via 15, from upper first surface 12 to lower second surface 13 of substrate 11. Plug 17 is formed in this central hole of via 15. Plug 17 may be formed during the formation of layers 14, or by a separate step particularly aimed at filling the hole within via 15.

The shape, dimensions, and materials of via 15 may vary, depending on the packaging application. For example, the diameter of via 15 may be larger or smaller. If larger interconnection balls are used, then via 15 may have a larger diameter, and vice versa. The desired size of the package and the reliability and electrical requirements of the package are also considerations in determining the size of via 15. As another example, instead of copper, metal plating 16 may be another metal, such as gold. As a final example, instead of epoxy solder mask material, plug 17 can be formed of a different material that is compliant, non-conductive, and does not form a bond with the metal of the land or interconnection ball. An alternative material for plug 17 is silicone, which is readily obtainable from the Dow Corning Company, among other sources.

At the intersection of via 15 and upper first surface 12 of substrate 11, via 15 is electrically connected to a conductive metal trace denoted as metallization 18, which extends laterally away from via 15 on upper first surface 12 of substrate 11. An opposite second end of metallization 18 is electrically connected to a conductive metal contact 19, which in turn is connected by a conductive bond wire 20 to a conductive bonding pad on die 10. Thus, there is a conductive path between die 10 and metal plating 16 of via 15. There are a variety of alternative, conventional ways to effect such an electrical connection, such as with tape automated bonding or a flip-chip configuration.

Returning to FIG. 1, a conductive approximately planar metal interconnection ball land 21 is formed around via 15, at the intersection of via 15 with lower second surface 13 of substrate 11. The metal of land 21 is integral with metal lining 16 of via 15, ensuring electrical connectivity, and is around plug 17. In the embodiment of FIG. 1, land 21 is formed of substantially planar layers of three different metals. Beginning at lower second surface 13 of substrate 11, these metal layers include: an underlying first metal layer 23, which is connected to plating 16 of via 15; an intermediate second metal layer 24; and a topmost third metal layer 25.

As examples, layer 23 may be copper that is approximately 0.019 mm to 0.038 mm thick; intermediate layer 24 may be nickel that is approximately 0.005 mm thick; and topmost layer 25 may be gold that is approximately 0.0005 mm thick. Each of these copper, nickel, and gold layers may be deposited on substrate 11 by conventional electroplating methods, such as the Learonal method.

In FIG. 1, the metal plane of land 41 has a discontinuity, specifically a circular hole, at its center. The hole is the center portion of via 15, which is adjacent to land 21 and filled with nonconductive epoxy solder mask material (i.e., plug 17). The exposed surface of plug 17, near lower second surface 13 of substrate 11 and adjacent to land 21, is substantially planar across via 15 and is approximately flush with the adjacent layer 25 of land 21. In an alternative embodiment, the exposed surface of plug 17 may be slightly below the adjacent metal surface of layer 25 of land 21.

Figure 2:
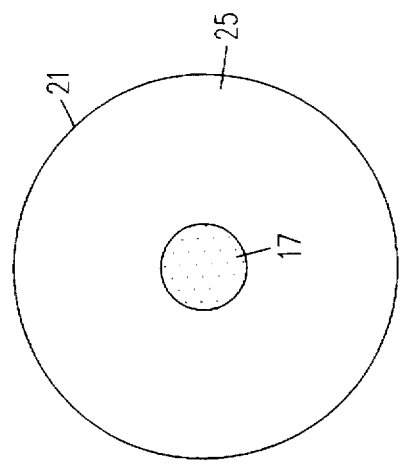
FIG. 2 is a top view of an interconnection ball land on the bottom external surface of a BGA package.

FIG. 2 is a top view of land 21 of FIG. 1. Land 21 is depicted as having an overall circular shape, although it may have other shapes, such as a square shape, depending on the application. The exposed surface of plug 17 of via 15 is adjacent to and at the approximate center of the metal surface of land 21. Layer 25 of land 21 is exposed in this view. Land 21 surrounds plug 17, and is electrically connected to metal plating 16 of via 15. Accordingly, there is a conductive path between land 21 and die 10 through metal plating 16 of via 15.

Figure 3:
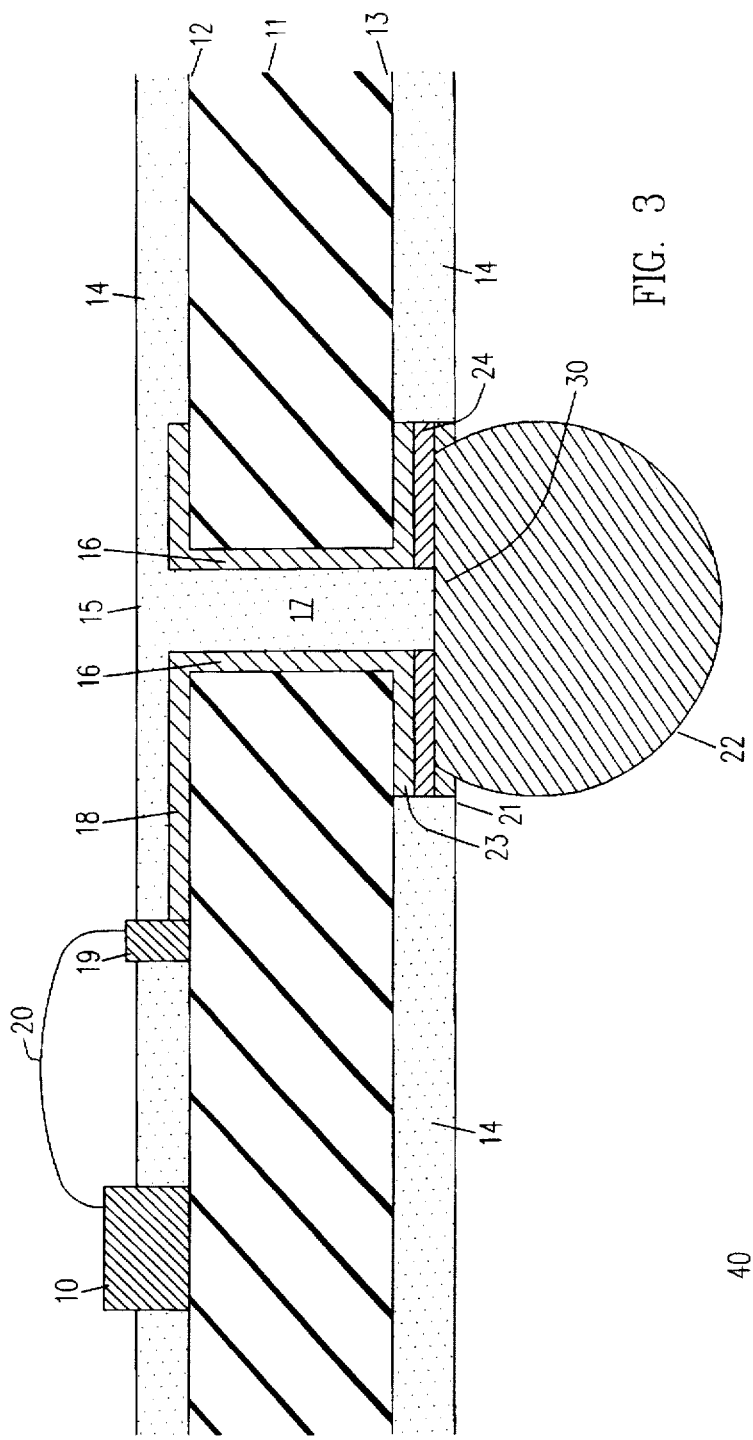
FIG. 3 is a cross-sectional side view of a portion of a BGA package, before encapsulation of the die and bond wires, which displays a single interconnection ball joint.

FIG. 3 shows an embodiment, in accordance with the present invention, of an interconnection ball joint 30, which was formed by the placement of a solder interconnection ball onto land 21 of FIGS. 1 and 2. Annular joint 30 is formed at the intersection of interconnection ball 22, interconnection ball land 21, and nonconductive plug 17. A conductive metal-to-metal annular bond forms around the circular plug 17 of nonconductive epoxy solder mask material, which is contained within via 15, near lower second surface 13 of substrate 11 and adjacent to land 21. A conductive path exists between interconnection ball 22 and die 10 through land 21, via 15, and the other conductive structures described above. The shape of the perimeter of the annular joint and bond may vary, for example, according to the shape of the interconnection ball. For example, the outer periphery of the resultant annular joint may be rectilinear, and the inner periphery of the annular joint may be circular.

Interconnection ball 22 serves as a conductive connection point between the BGA package and an external circuit board (not shown).

In the embodiment of FIG. 3, interconnection ball 22 is formed of eutectic 63/37 tin/lead solder. Alternatively, other solders may be used to form interconnection ball 22, such as non-eutectic tin/lead solder, non-lead solders, or other low melting point solders formed of a metal or an alloy of metals.

In the example of FIG. 3, the eutectic solder of interconnection ball 22 is shaped, heated, and placed onto land 21. Upon re-solidification of the solder, a metal-to-metal annular bond is formed about circular plug 17 between interconnection ball 22 and land 21 (see FIG. 2).

Where metal layers 23, 24, and 25 of land 21 are copper, nickel, and gold, respectively, as in the example described above, the metal-to-metal bond at joint 30 is primarily between the nickel intermediate layer 24 and the eutectic tin/lead solder of interconnection ball 22, because all or most of gold layer 25 dissolves into the solder. Accordingly, FIG. 3 does not show gold layer 25.

Joint 30 of FIG. 3 does not have an uninterrupted metal-to-metal bond like the interconnection ball joints of the conventional BGA packages described above. Circular plug 17 in via 15 is at the approximate center of land 21 (see FIG. 2) and joint 30. Because of this epoxy-filled circular hole in the metal horizontal plane of land 21, there is a circular discontinuity in the metal-to-metal bonding at joint 30. Interconnection ball 22 forms a metal-to-metal annular bond with the planar metal surface of land 21 about plug 17, but does not bond with the nonconductive surface of plug 17.

Applicants have discovered that interconnection ball joints, such as the example of FIG. 3, having a discontinuity in the metal-to-metal bonding between the interconnection ball and the metal land demonstrate significantly higher shearing strengths than the uninterrupted metal-to-metal joints of conventional BGA packages. This result is unexpected, assuming similar size interconnection ball lands, because the area of the metal-to-metal bond of the interconnection ball joint is smaller. Applicants hypothesize that the discontinuity in the metal-to-metal bond (i.e., the central hole of via 15, which is filled with plug 17 of a non-conductive material) functions like a hole drilled in a glass automobile windshield at the tip of a propagating crack. The hole stops the crack from propagating further. In the case of FIG. 1, joint 30 reduces the risk of electrical connectivity failures due to, for example, cracking of nickel layer 24.

The embodiment of FIG. 3 is particularly suited for current and future BGA packaging applications, because of its efficient, compact design. By placing interconnection ball 22 onto land 21, opposite and directly below via 15 and plug 17, and by using via 15 as the discontinuity in land 21, metal traces on the lower surface of the BGA package can be eliminated. This reduces the package's surface area and cost.

Figure 4:
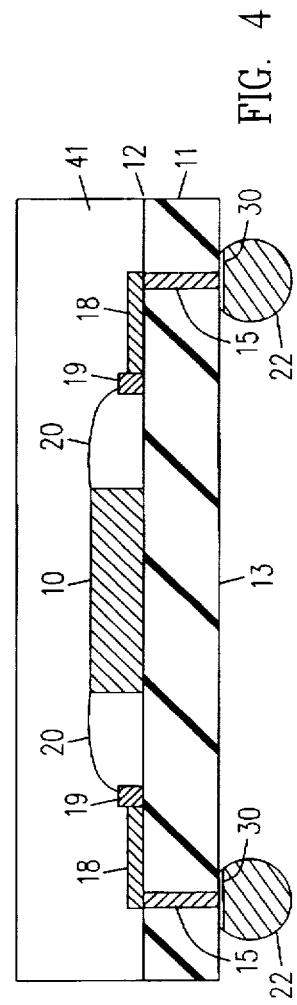
FIG. 4 is a cross-sectional side view of an integrated circuit package showing a plurality of interconnection ball joints.

FIG. 4 is a cross-sectional side view of an exemplary integrated circuit package 40 employing interconnection ball joints in accordance with the present invention. FIG. 4 includes components described above with respect to FIGS. 1—3. For clarity, FIG. 4 only shows two of bond wires 20, contacts 19, metal traces 18, vias 15, interconnection balls 22, and joints 30, although many more of these structure may exist in a typical package, depending on the particular packaging application. Also for clarity, layers 14 and plug 17 are not shown.

FIG. 4 shows encapsulating material 41, which covers and seals die 10, bond wires 20, contacts 19, metal trace 18, and the remainder of first surface 12 of substrate 11 within package 40. Encapsulating material 41 may be, for example, plastic, such as an epoxy resin or other resin conventionally used in semiconductor packages for encapsulation.

The above-described embodiments are exemplary. Other embodiments, within the scope of the claims below, will be apparent to those skilled in the art.

We claim:

1. An interconnection ball joint in an integrated circuit package comprising:

a substrate having a first surface and an opposite second surface;

a metallized via extending through the substrate from the first surface to the second surface of the substrate, said via including a central hole which extends from the first surface to the second surface of the substrate;

a metallic interconnection ball land, on the second surface of the substrate, integral with the metallized via and adjacent to the hole;

the hole containing a nonconductive material plugging the hole adjacent to the land;

a metallic solder interconnection ball; and wherein the interconnection ball is in a metal-to-metal annular bond with the land around the hole.

2. The interconnection ball joint of claim 1, wherein the land includes layers of different metals.

3. The interconnection ball joint of claim 2, wherein the land includes a layer of nickel and a layer of copper.

4. The interconnection ball joint of claim 3, wherein the nonconductive material is an epoxy material.

5. The interconnection ball joint of claim 1, wherein the nonconductive material is an epoxy material.

6. A package for an integrated circuit comprising:

a substrate having a first surface and an opposite second surface;

an integrated circuit die affixed to the first surface;

a metallized via extending through the substrate from the first surface to the second surface of the substrate, said via including a central hole which extends from the first surface to the second surface of the substrate;

a metallic interconnection ball land, on the second surface of the substrate, integral with the metallized via and adjacent to the hole;

the hole containing a nonconductive material plugging the hole adjacent to the land;

a metallic solder interconnection ball;

wherein the interconnection ball is in a metal-to-metal annular bond with the land around the hole; and wherein the interconnection ball is electrically connected to the integrated circuit die by a conductive path which extends through the metallized via.

7. The package of claim 6, wherein the land includes layers of different metals.

8. The package of claim 7, wherein the land includes a layer of nickel and a layer of copper.

9. The package of claim 7, wherein the nonconductive material is an epoxy material.

10. The package of claim 6, wherein the nonconductive material is an epoxy material.

11. The package of claim 10, wherein the conductive path includes a metal trace on the first surface of said substrate, and a metal bond wire.

12. The package of claim 11, further comprising an encapsulating material, wherein the encapsulating material covers the integrated circuit die, the metal trace, the bond wire, and the first surface of the substrate.

13. The package of claim 12, wherein the land includes a layer of nickel and a layer of copper.

* * * * *